(12) United States Patent
Horn et al.

(10) Patent No.: US 8,345,224 B2
(45) Date of Patent: Jan. 1, 2013

(54) METHODS AND DEVICES FOR DRIVING MICROMIRRORS

(75) Inventors: Jan Horn, Ulm (DE); Christian Kempter, Wittislingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 118 days.

(21) Appl. No.: 13/038,734

(22) Filed: Mar. 2, 2011

(65) Prior Publication Data

US 2011/0188017 A1 Aug. 4, 2011

Related U.S. Application Data

(63) Continuation of application No. PCT/EP2009/007175, filed on Oct. 6, 2009.

(60) Provisional application No. 61/103,691, filed on Oct. 8, 2008.

(30) Foreign Application Priority Data

Oct. 8, 2008 (DE) .......................... 10 2008 050 446

(51) Int. Cl.
*G03B 27/54* (2006.01)
*G03B 27/32* (2006.01)
*G03B 27/68* (2006.01)
*G03B 27/42* (2006.01)
*G03B 27/52* (2006.01)

(52) U.S. Cl. ................. 355/67; 355/52; 355/53; 355/55; 355/77

(58) Field of Classification Search ..................... 355/52, 355/53, 55, 67–71, 77; 359/223.1, 290–291, 359/295, 849, 850, 853, 855, 865; 250/492.1, 250/492.2, 492.22, 548

See application file for complete search history.

(56) References Cited

U.S. PATENT DOCUMENTS 6,300,665 B1 10/2001 Peeters et al.
6,717,325 B2 4/2004 Fernandez et al.
(Continued)

FOREIGN PATENT DOCUMENTS

DE 103 43 333 4/2005
(Continued)

OTHER PUBLICATIONS

Japanese Office Action, with English translation, for corresponding JP Appl No. 2011-530409, dated Mar. 9, 2012.
(Continued)

*Primary Examiner* — Toan Ton
*Assistant Examiner* — Christina Riddle
(74) *Attorney, Agent, or Firm* — Fish & Richardson P.C.

(57) ABSTRACT

A micromirror of a micromirror array in an illumination system of a microlithographic projection exposure apparatus can be tilted through a respective tilt angle about two tilt axes. The micromirror is assigned three actuators which can respectively be driven by control signals in order to tilt the micromirror about the two tilt axes. Two control variables are specified, each of which is assigned to one tilt axis and which are both assigned to unperturbed tilt angles. For any desired combinations of the two control variables, as a function of the two control variables, one of the three actuators is selected and its control signal is set to a constant value, in particular zero. The control signals are determined so that, when the control signals are applied to the other two actuators, the micromirror adopts the unperturbed tilt angles as a function of the two control variables.

28 Claims, 5 Drawing Sheets

U.S. PATENT DOCUMENTS

| | | | |
|---|---|---|---|
| 6,735,004 B1 | 5/2004 | Hajelin et al. | |
| 6,781,731 B2 * | 8/2004 | Choi | 359/220.1 |
| 2003/0081882 A1 * | 5/2003 | Yamashita et al. | 385/16 |
| 2003/0156315 A1 * | 8/2003 | Li et al. | 359/290 |
| 2003/0189389 A1 * | 10/2003 | Fernandez et al. | 310/309 |
| 2004/0114259 A1 * | 6/2004 | Ishizuya et al. | 359/849 |
| 2004/0165249 A1 * | 8/2004 | Aubuchon | 359/291 |
| 2005/0206992 A1 * | 9/2005 | Ishii | 359/290 |
| 2007/0159025 A1 | 7/2007 | Muchika | |
| 2009/0067033 A1 | 3/2009 | Kajino et al. | |
| 2010/0157269 A1 * | 6/2010 | Deguenther et al. | 355/67 |
| 2010/0309449 A1 * | 12/2010 | Horn et al. | 355/71 |

FOREIGN PATENT DOCUMENTS

| | | |
|---|---|---|
| JP | 10-123438 A | 5/1998 |
| JP | 2002-156593 A | 5/2002 |
| JP | 2002-189176 A | 7/2002 |
| JP | 2003-5102 A | 1/2003 |
| JP | 2005-518954 A | 6/2005 |
| JP | 2006-518884 A | 8/2006 |
| WO | WO 03/076977 | 9/2003 |
| WO | WO 2005/085125 | 9/2005 |
| WO | WO 2006/112387 | 10/2006 |
| WO | WO 2009/080310 | 7/2009 |

OTHER PUBLICATIONS

The International Search Report for the corresponding PCT Application No. PCT/EP2009/007175, mailed Feb. 22, 2010.

German Office Action with English translation for corresponding DE Appl No. 10 2008 050 446.7, dated May 27, 2009.

* cited by examiner

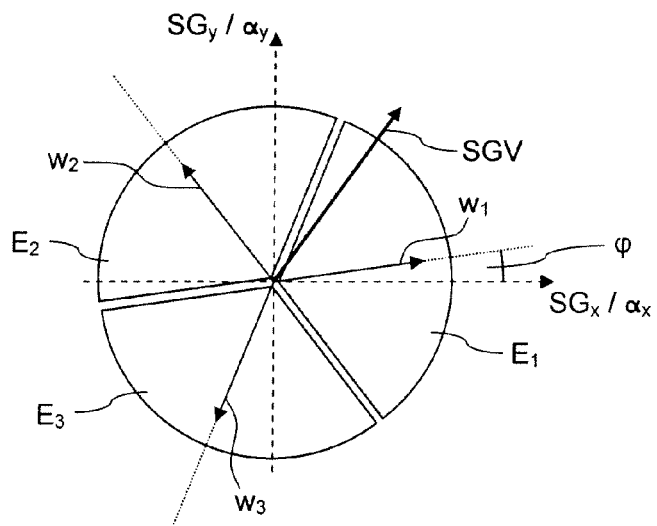
Fig. 4
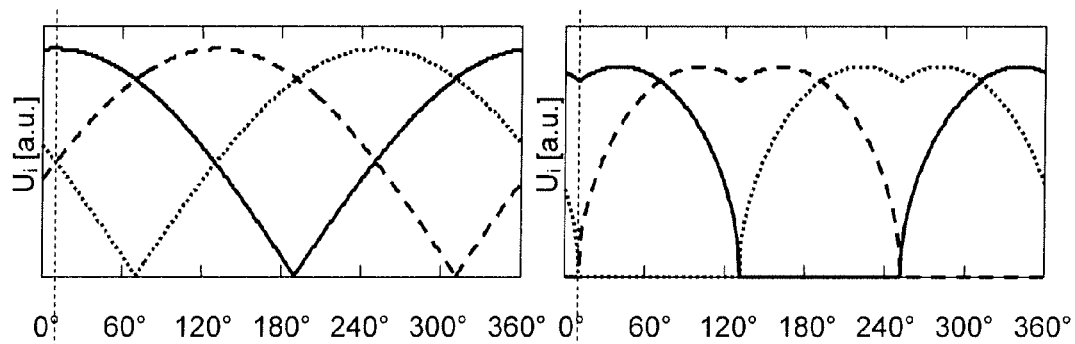
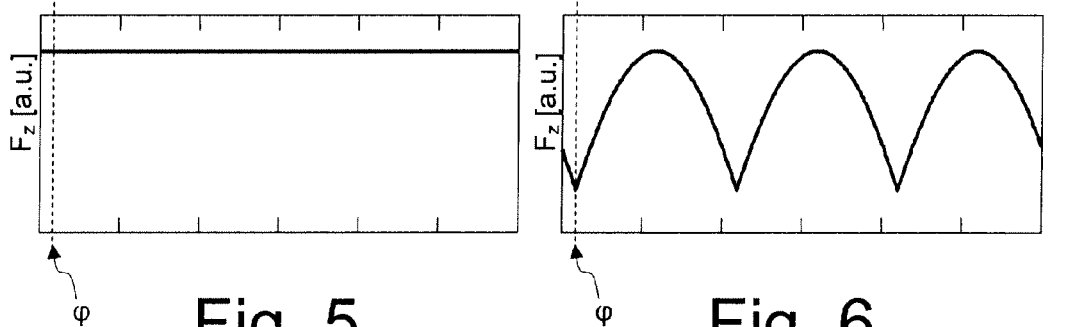
Fig. 5        Fig. 6
Prior Art

METHODS AND DEVICES FOR DRIVING MICROMIRRORS

CROSS-REFERENCE TO RELATED APPLICATIONS

This application is a continuation of, and claims benefit under 35 USC 120 to, international application PCT/EP2009/007175, filed Oct. 6, 2009, which claims benefit under 35 USC 119 of German Application No. 10 2008 050 446.7, filed Oct. 8, 2008 and under 35 USC 119(e) of U.S. Ser. No. 61/103,691, filed Oct. 8, 2008. International application PCT/EP2009/007175 is hereby incorporated by reference in its entirety.

FIELD

The disclosure relates to methods and devices for driving micromirrors, which are used in an illumination system of a microlithographic projection exposure apparatus, in order to influence the illumination angle distribution of the projection light.

BACKGROUND

The use of so-called multi-mirror arrays (MMAs, also referred to as micromirror arrays or micromirror matrices), which include a multiplicity of individually drivable micromirrors, has recently been envisaged for illumination systems of microlithographic projection exposure apparatus in order to deviate individual sub-beams of the projection light of the illumination system in different directions. With the aid of the micromirrors, for example, the respective light sub-beams of the projection light can thus be directed onto different positions in a pupil surface of the illumination system. Since the intensity distribution in a pupil surface of the illumination system importantly influences the illumination angle distribution of the projection light, the illumination angle distribution can be specified more flexibly owing to the individual drivability of the micromirrors. Particularly in connection with so-called unconventional illumination settings, in which an annular region or a plurality of poles are illuminated in the pupil surface, the use of MMAs makes it possible to adapt the illumination angle distribution to the respective circumstances, and in particular to the mask to be projected, without for example diffractive optical elements having to be replaced.

Such MMAs are often produced as microelectromechanical systems (MEMS) via lithographic methods, such as are known from semiconductor technology. The typical structure sizes are sometimes a few micrometres. Known examples of such systems are, for example, MMAs whose micromirrors can be tilted digitally about an axis between two end positions. Such digital MMAs are often used in digital projectors for showing images or films.

For use in the illumination system of a microlithographic projection exposure apparatus, the micromirrors of the MMAs however are desirably capable of quasi-continuously adopting every tilt angle within a working angle range. In particular, the micromirrors are desirably tiltable about two tilt axes. Thus, for example, there are known micromirrors whose mirror surfaces are mounted in a type of universal suspension, and can be tilted with the aid of actuators, about two tilt axes. The actuators may, for example, be configured as electrostatic or electromagnetic actuators. In a known arrangement having electrostatic actuators, the micromirror with its two tilt axes is mounted over four control electrodes and has a mating or mirror electrode on its rear side. When a voltage is applied between a control electrode and the mating electrode, an attractive force action is created between them owing to electrostatic attraction. Each tilt axis is assigned two opposite control electrodes and the micromirror can be tilted in one direction or the other, depending on which electrode is driven. Through various combinations of tilting about the two tilt axes, the mirror can be tilted into any position within its working angle range.

In order to drive the individual actuators, each actuator has its own voltage or current supply line and the drive circuits connected therewith. In order to keep this outlay small and allow a maximally high packing density of the micromirrors in an MMA, US 2003/0189389 A1 therefore proposes a system in which only three actuators are used. Since the driving of the individual actuators no longer acts independently on a single tilt axis when using three actuators, however, a method is employed therein by which the three control signals of the actuators can be determined from two control variables for the tilting about the two tilt axes. In this method, the three control signals are calculated from the two control variables by using a linear equation system. The solution set of the equation system is restricted by various constraint conditions. For instance, one of the desired aspects of this conversion is that the two control variables respectively cause tilting about the associated tilt axes independently of one another. Another constraint condition is that the total force exerted by the three actuators onto the micromirror is kept constant.

Since the use of micromirrors in illumination systems of microlithographic projection exposure apparatus places very great demands on the accuracy of the mirror alignment, signal amplifiers such as for example high-voltage output stages, which supply the actuators with variable control signals, desirably also satisfy the most stringent of desired aspects with respect to signal stability and reproducibility in that system.

SUMMARY

The disclosure provides methods and devices for driving a micromirror which can help reduce the outlay for driving the actuators of the micromirror.

In some embodiments, a micromirror array is arranged in an illumination system of a microlithographic projection exposure apparatus and contains a micromirror. The micromirror can be tilted through a respective tilt angle about two tilt axes. The micromirror is furthermore assigned three actuators which can respectively be driven by control signals in order to tilt the micromirror about the two tilt axes. Two control variables are subsequently specified, each of which is assigned to one tilt axis and which are both assigned to unperturbed tilt angles. Next, for any desired combinations of the two control variables, as a function of the two control variables, one of the three actuators is selected and its control signal is set to a constant value, in particular zero. The control signals are then determined so that, when the control signals are applied to the other two actuators, the micromirror adopts the unperturbed tilt angles as a function of the two control variables. Lastly, the control signals are applied to the actuators.

Thus, for a micromirror which can be tilted by three actuators about two tilt axes, according to the disclosure the conversion of the two control variables which are assigned to the tilt angles about the tilt axes into the three control signals is selected so that in every case one of the actuators receives a control signal set to zero, or at least to a constant value. In this way only two signal amplifiers, which generate correspondingly varied control signals and apply them to the other two actuators, are respectively used in order to drive a particular tilt angle combination. The actuator whose control signal is set to a constant value, in particular zero, may for example be set to a predefined value by a simple multiplex circuit. This predefined value may be selected by a signal amplifier to be equal for all groups of micromirrors of the micromirror array, so that fewer than three signal amplifiers are used in total for each individual micromirror.

The control variables are advantageously assigned linearly to the unperturbed tilt angles, since the driving of the micromirror via the three actuators is kept simpler with respect to preceding steps, for example a control and regulation algorithm, by such assignment.

The actuator whose control signal is set to a constant value, in particular zero, may be selected by assigning a two-dimensional control variable vector with a direction to the two control variables, which are assigned to the unperturbed tilt angles about the two tilt axes. An effective tilt vector is furthermore assigned to each individual actuator, and then the actuator whose effective tilt vector has a direction which is not immediately adjacent to the direction of the control variable vector is selected. This makes it possible to represent the two-dimensional control variable vector as a linear combination of the two immediately adjacent effective tilt vectors. The effective tilt vector which is not immediately adjacent, and has a component which opposes the control variable vector, is therefore eliminated from the linear combination. The direction of the effective tilt vectors not being immediately adjacent is also intended to include cases in which the control variable vector and an effective tilt vector coincide, and both remaining control signals of the actuators are therefore set to zero.

The aforementioned effective tilt vectors of an actuator are in this case obtained from the control variables that are assigned to the unperturbed tilt angles, which the micromirror adopts when only this actuator is driven. The effective tilt vector therefore represents the way in which, i.e. how strongly and in which direction, each individual actuator affects the tilting of the micromirror.

Instead of determining the effective tilt vectors from design data, it may be advantageous to determine the effective tilt vectors by measurement. Manufacturing tolerances in the production of the micromirrors and the respectively assigned actuators will thereby be taken into account.

In the aforementioned method, the directions of the control variable vector and the effective tilt vectors are preferably determined according to $$\theta = \arctan\left(\frac{SG_y}{SG_x}\right)$$

where $SG_x$ and $SG_y$ are the control variables assigned to the unperturbed tilt angles about the respective tilt axis and $\theta$ indicates the angle that the respective vector makes with a direction y which coincides with one of the two tilt axes.

In principle, the three actuators can be arranged in any desired way and, for example in the case of electrostatic actuators, shaped in any desired way, so long as their effective tilt vectors can generate all given control variable vectors using a positive linear combination, i.e. so long as every control variable vector can be represented by positive multiples of the effective tilt vectors. For optimal distribution of the forces, however, it is advantageous for the actuators to be arranged with threefold symmetry.

The result of this, for the preceding case, is that the effective tilt vector of a first actuator has a direction which coincides with the direction y to within an alignment angle $\phi$, the effective tilt vector of a second actuator essentially makes an angle of 120° with the effective tilt vector of the first actuator, and the effective tilt vector of a third actuator essentially makes an angle of 120° with the effective tilt vector of the second actuator. After the direction $\theta$ of the control variable vector has been determined, the third actuator ($E_3$) is then selected for $\theta \in [\phi, 120°+\phi]$, the first actuator ($E_1$) is selected for $\theta \in [120°+\phi, 240°+\phi]$, and the second actuator ($E_2$) is selected for $\theta \in [240°+\phi, 360°+\phi]$.

In order to be able to adjust the tilt angles of the micromirror even more accurately, it is advantageous for the two control variables to be determined in the method, in the step in which they are specified, from setpoint tilt angles by a control algorithm, a regulation algorithm or a combined control and regulation algorithm.

In this case, it is furthermore advantageous to specify target tilt angles for this purpose and to determine a trajectory which includes a sequence of setpoint tilt angles. This trajectory represents a transition of actual tilt angles, through which the micromirror is instantaneously tilted, to the target tilt angles.

Preferably, calibration data are taken into account when determining the setpoint tilt angles. In this way, superordinate systems are free from the desire to correct possible erroneous settings of the mirrors.

A regulation algorithm for determining the two control variables may in this case be configured so that the two control variables are specified by the regulation algorithm or corrected thereby, the regulation algorithm receiving a regulation difference. The regulation difference is determined from the setpoint tilt angles and negative feedback of the actual tilt angles, measured by a monitoring system, through which the micromirror is instantaneously tilted. Such a regulation algorithm can compensate for perturbations which affect the instantaneous tilt angles.

It is also advantageously possible to provide a control algorithm, by which the two control variables are specified by assigning them to the setpoint tilt angles with the aid of a predictive control algorithm, which uses an inverse system dynamics model.

The steps of the method, in which the actuator whose control signal is set to zero is selected and in which the other two control signals are determined, furthermore preferably include the option of determining the control signals for given control variables from an assignment table. In this way, the control signals need not be determined from calculation rules. Nevertheless, interpolation may advantageously be employed, in particular bilinear or bicubic interpolation, in order to determine intermediate values from the assignment table or in order to obtain a continuous function for determining the control signals.

The assignment table between the two control variables and the three control signals is in this case compiled so that the assignment table is compiled in a parameterisation phase by applying various control signals to the actuators, measuring the tilt angles resulting therefrom and subsequently assigning the two control variables linearly to the resulting tilt angles. In this case, one control signal is respectively already kept constant, in particular zero, when the control signals are being applied.

In another advantageous option for determining the control signals, for given control variables the control signals are determined with the aid of a calculation rule which uses a parameter vector. Since interpolation can be obviated in this option, it can lead to more accurately determined control signals.

The parameter vector used may be determined from design data. Preferably, however, the parameter vector is determined in a parameterisation phase by estimation from at least 3 assignments between tilt angles and control signals of the three actuators. These at least six assignments are determined by applying various control signals to the actuators and measuring tilt angles resulting therefrom.

Another aspect of the disclosure provides a method for driving a micromirror, in which a micromirror array is initially provided, which is arranged in an illumination system of a microlithographic projection exposure apparatus and contains the micromirror, the micromirror being tiltable through a respective tilt angle about two tilt axes. The micromirror is assigned three actuators which can respectively be driven by control signals in order to tilt the micromirror about the two tilt axes. In a second step, an assignment table between the tilt angles and the control signals of the three actuators is compiled by activating and measuring a plurality of tilt angles of the micromirror and storing the control signals applied to the three actuators for this. Two control variables are subsequently specified, each of which is assigned to one tilt axis and which are both assigned linearly to unperturbed tilt angles. Control signals, which cause the micromirror to tilt though the unperturbed tilt angles, are then determined by linearly assigning the two control variables to the tilt angles of the assignment table according to the assignment in the previous step and reading out the control signals assigned to these tilt angles from the assignment table. Lastly, the control signals are applied to the actuators. The advantage of the method just described is that owing to the compilation of the assignment table, no further considerations desirably are made regarding the relationship between the control signals, the control variables and the tilt angles, and the method is therefore very simple to configure. In particular, no errors which are due to simplifying model assumptions then occur. Interpolation, in particular bilinear or bicubic interpolation, may also be employed in this method in connection with the assignment table.

Instead of using a method in which an assignment table is compiled as just described, another aspect of the disclosure provides a method for driving a micromirror, in which a micromirror array is initially provided, which is arranged in an illumination system of a microlithographic projection exposure apparatus and contains the micromirror, the micromirror being tiltable through a respective tilt angle about two tilt axes. The micromirror is assigned three actuators which can respectively be driven by control signals in order to tilt the micromirror about the two tilt axes. Next, at least 3 assignments between the tilt angles and the control signals of the three actuators are determined by activating and measuring various tilt angles of the micromirror and the control signals applied to the three actuators for this. A parameter vector is then estimated from the assignments obtained in the previous step. Two control variables are subsequently specified, each of which is assigned to one tilt axis. With the aid of a calculation rule which uses the estimated parameter vector, the control signals are then determined for given control variables. Lastly, the control signals are applied to the actuators.

In the methods just described which use a parameter vector, since the parameter vector is overdetermined with more than 3 assignments, it is for example estimated by a least-squares estimator in order to reduce the errors primarily due to measurement inaccuracies.

Each of the methods described above preferably operates with a micromirror, which can respectively adopt at least three different tilt angles about the tilt axes. This makes it possible to illuminate at least nine different positions of the pupil surface with projection light. According to another option, the micromirror can quasi-continuously adopt all angles in its working angle range.

In device terms, the above methods are carried out with the aid of drive electronics for driving a micromirror which is contained in a micromirror array, which is arranged in an illumination system of a microlithographic projection exposure apparatus. The micromirror has two tilt axes and three actuators are assigned to the micromirror. The three actuators can respectively be driven by control signals in order to tilt the micromirror about the two tilt axes. The drive electronics include a converter having an input for control variables, which are assigned to unperturbed tilt angles about the two tilt axes. The drive electronics furthermore include two signal amplifiers, which can be controlled by the converter, and a switching unit by which control signals can be applied to the three actuators. As a function of the control variables applied to the input of the converter, the control signal of one of the three actuators can be set to a constant value, in particular zero, with the aid of the converter and the switching unit. The other two control signals can be applied to the actuators with the aid of the converter, the switching unit and the two signal amplifiers, so that the micromirror adopts the unperturbed tilt angles, assigned to the control variables, about the two tilt axes.

In order to adjust the tilt angle about the two tilt axes even more accurately, the converter's input for control variables is preferably connected to a control system, a regulation system or a combined control and regulation system, by which the control variables can be determined from setpoint tilt angles.

It is furthermore advantageous for the converter to include a memory for an assignment table, from which the control signals of the three actuators can be determined as a function of the control variables applied to the input of the converter. Advantageously, a mechanism may be provided which allow interpolation of the control signals, in particular bilinear or bicubic interpolation.

In another advantageous embodiment of a converter, it includes a calculation unit by which, with the aid of a calculation rule which uses a parameter vector, the control signals of the three actuators can be calculated as a function of the control variables applied to the input of the converter.

According to another aspect of the disclosure, drive electronics for driving a micromirror which is contained in a micromirror array, which is arranged in an illumination system of a microlithographic projection exposure apparatus, the micromirror having two tilt axes and the micromirror being assigned three actuators, which can respectively be driven by control signals in order to tilt the micromirror about the two tilt axes, include a converter having an input for control variables. The control variables are assigned to unperturbed tilt angles about the two tilt axes. The drive electronics furthermore include signal amplifiers, which can be controlled by the converter and are connected directly or indirectly to the actuators. In this way, the control signals can be applied to the actuators. The converter now includes a memory for an assignment table, from which the control signals of the three actuators can be determined as a function of the control variables applied to the input of the converter. Here again, a mechanism may advantageously be provided which allow interpolation of the control signals, in particular bilinear or bicubic interpolation.

According to another aspect of the disclosure, drive electronics for driving a micromirror which is contained in a micromirror array, which is arranged in an illumination system of a microlithographic projection exposure apparatus, the micromirror having two tilt axes and the micromirror being assigned three actuators, which can respectively be driven by control signals in order to tilt the micromirror about the two tilt axes, include a converter having an input for control variables. The control variables are assigned to unperturbed tilt angles about the two tilt axes. The drive electronics furthermore include signal amplifiers, which can be controlled by the converter and are connected directly or indirectly to the actuators. In this way, the control signals can be applied to the actuators. The converter now includes a calculation unit by which, with the aid of a calculation rule that uses a parameter vector which can be estimated in a parameterisation phase, the control signals of the three actuators can be calculated as a function of the control variables applied to the input of the converter.

The above drive electronics are preferably combined with a micromirror, which is contained in a micromirror array that is arranged in an illumination system of a microlithographic projection exposure apparatus, to form a micromirror system. In this case, the micromirror has two tilt axes and three actuators are assigned to the micromirror in order to tilt the micromirror about the two tilt axes.

Furthermore, the disclosure provides a method for switching an illumination setting in an illumination system of a microlithographic projection exposure apparatus, including the following steps:
a) providing a micromirror array which is arranged in the illumination system and contains M micromirrors, wherein each micromirror is tiltable through a respective tilt angle about two tilt axes;
b) driving k=1, 2, ..., M individual micromirrors in order to switch from a first illumination setting to a second illumination setting, wherein switching between the two illumination settings is completed, for each k=1, 2, ..., M, within a time period of less than 50 milliseconds.

Since the micromirrors influence the illumination setting of the illumination system this method allows very fast switches between different illumination settings despite the usually high number M of micromirrors in a micromirror array. The number k of individual micromirrors whose tilt angles have to be changed in order to switch from one illumination setting to another depends on the difference between the two illumination settings. This number k and the respective old and new tilt angles of the micromirrors will be determined by higher level algorithms, which try to change the tilt angles of only as much micromirrors as desired for a switch of the illumination settings. However, the method also includes changing the tilt angles of all M micromirrors within 50 milliseconds.

Preferably, such a method for fast switching illumination settings is achieved by driving the individual micromirrors with a method according to one of methods explained above. Since the above mentioned methods allow a reduction of the number of desired signal amplifiers and corresponding drive electronics, signal paths are shortened, leading to a very fast switching of micromirror tilt angles. With appropriate setups according to these methods also the number of signals to be transferred by the drive electronics may be reduced, leading to a further speed up of the switching of illumination settings.

According to another aspect of the disclosure an illumination system of a microlithographic exposure apparatus is provided, including a micromirror array which contains M micromirrors, wherein each micromirror is tiltable through a respective tilt angle about two tilt axes. The system further includes drive electronics for driving the individual micromirrors, the drive electronics being capable of switching the illumination setting from a first illumination setting to a second illumination setting by driving k=1, 2, ..., M individual micromirrors such that the switching between the two illumination settings is completed, for each k=1, 2, ..., M, within a time period of less than 50 milliseconds. Such illumination systems with a fast switching of the illumination setting provide higher throughput.

Preferably, such an illumination system uses the above mentioned drive electronics as drive electronics.

Preferably, the number M of tiltable micromirrors in such an illumination system is more than 1000, preferably more than 4000, giving the possibility to provide different illumination settings with a high resolution.

BRIEF DESCRIPTION OF THE DRAWINGS

Other features and advantages of the disclosure may be found in the following description of embodiments with the aid of the drawings, in which:

FIG. 4 shows a schematic representation which illustrates the relationship between the orientation and effect of the actuators and the tilting of the micromirror;

FIG. 5 shows a diagram of the control signals applied to the actuators (top) and a force action resulting therefrom on the micromirror (bottom) according to a device known from the prior art;

FIG. 6 shows a diagram of the control signals applied to the actuators (top) and a force action resulting therefrom on the micromirror (bottom) using the method according to the disclosure for driving the micromirror;

DESCRIPTION OF PREFERRED EMBODIMENTS

Figure 1:
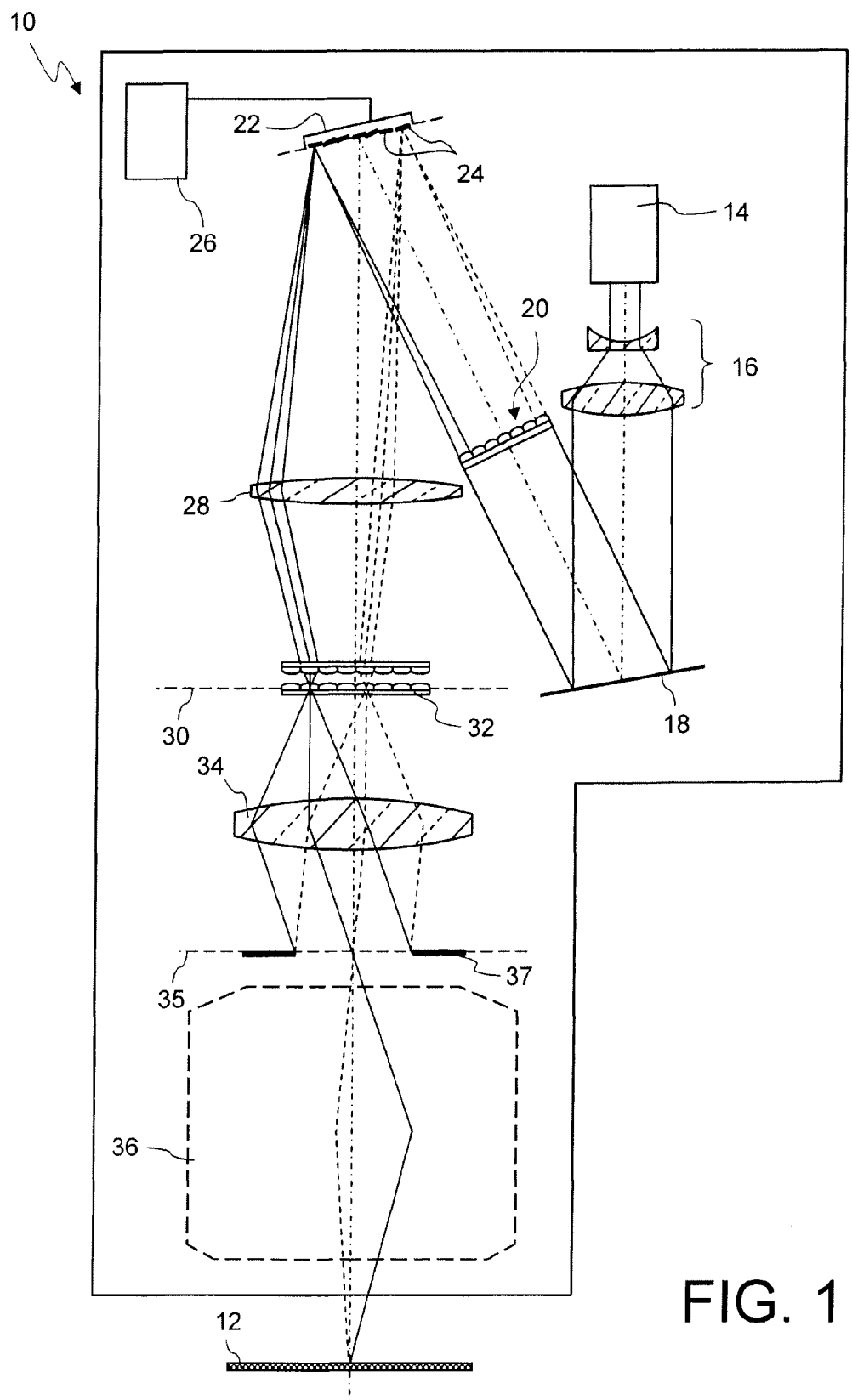
FIG. 1 shows a simplified meridian section through the illumination system of a microlithographic projection exposure apparatus having a multi-mirror array.

FIG. 1 shows an illumination system 10 of a microlithographic projection exposure apparatus in a highly simplified meridian section. The illumination system 10 is used for suitably illuminating a mask 12, which carries lithographic structures to be imaged. Usually, maximally uniform illumination of the mask 12 with projection light is desired so that the structures on the mask 12 can be transferred as uniformly as possible onto a wafer coated with a resist. Besides the total intensity striking a mask point, another factor which importantly influences the imaging properties of a microlithographic projection exposure apparatus is the illumination angle distribution of the projection light. This is intended to mean the distribution, between the different incidence angles at which the light strikes the mask point, of the total intensity of the light striking a mask point. In particular, it is desirable to adapt the illumination angle distribution to the type of structures to be illuminated, in order to achieve maximally optimal imaging.

To this end the illumination system 10 includes a multiplicity of optical elements in its beam path, which in FIG. 1 are mostly represented only in a highly simplified way or not at all. The projection light generated by a laser 14 or another light source is initially expanded by first optics 16 and directed by a plane mirror 18 onto a microlens array 20. The plane mirror 18 is primarily used to keep the external dimensions of the illumination system 10 compact.

Following the beam path further, the projection light strikes a so-called multi-mirror array 22 which will be explained below with reference to FIG. 2. The multi-mirror array 22 includes a multiplicity of micromirrors 24 which can be tilted, preferably individually, by a drive instrument 26. The upstream microlens array 20 focuses individual light sub-beams of the projection light onto the micromirrors 24.

With the aid of the drive instrument 26, the individual micromirrors 24 can be tilted so that the light sub-beams of the projection light pass, via second optics 28, through a pupil surface 30 at freely selectable positions. A fly's eye integrator 32 arranged near this pupil surface 30 generates a multiplicity of secondary light sources in the pupil surface 30, which, via a third optics 34, uniformly illuminate an intermediate field plane 35 in which adjustable stop elements 37 are arranged. The third optics 34 generate an assignment between angles in the pupil surface 30 and positions in the intermediate field plane 35. The latter is imaged by an objective 36 onto a mask plane, in which the mask 12 is arranged. The intensity distribution in the pupil surface 30 therefore determines the illumination angle distribution not only in the intermediate field plane 35 but also in the mask plane.

By different tilting of the individual micromirrors 24 of the multi-mirror array 22, different illumination angle distributions can therefore be set up very flexibly. With suitable driving of the micromirrors 24, the illumination angle distribution can even be modified during an exposure.

Figure 2:
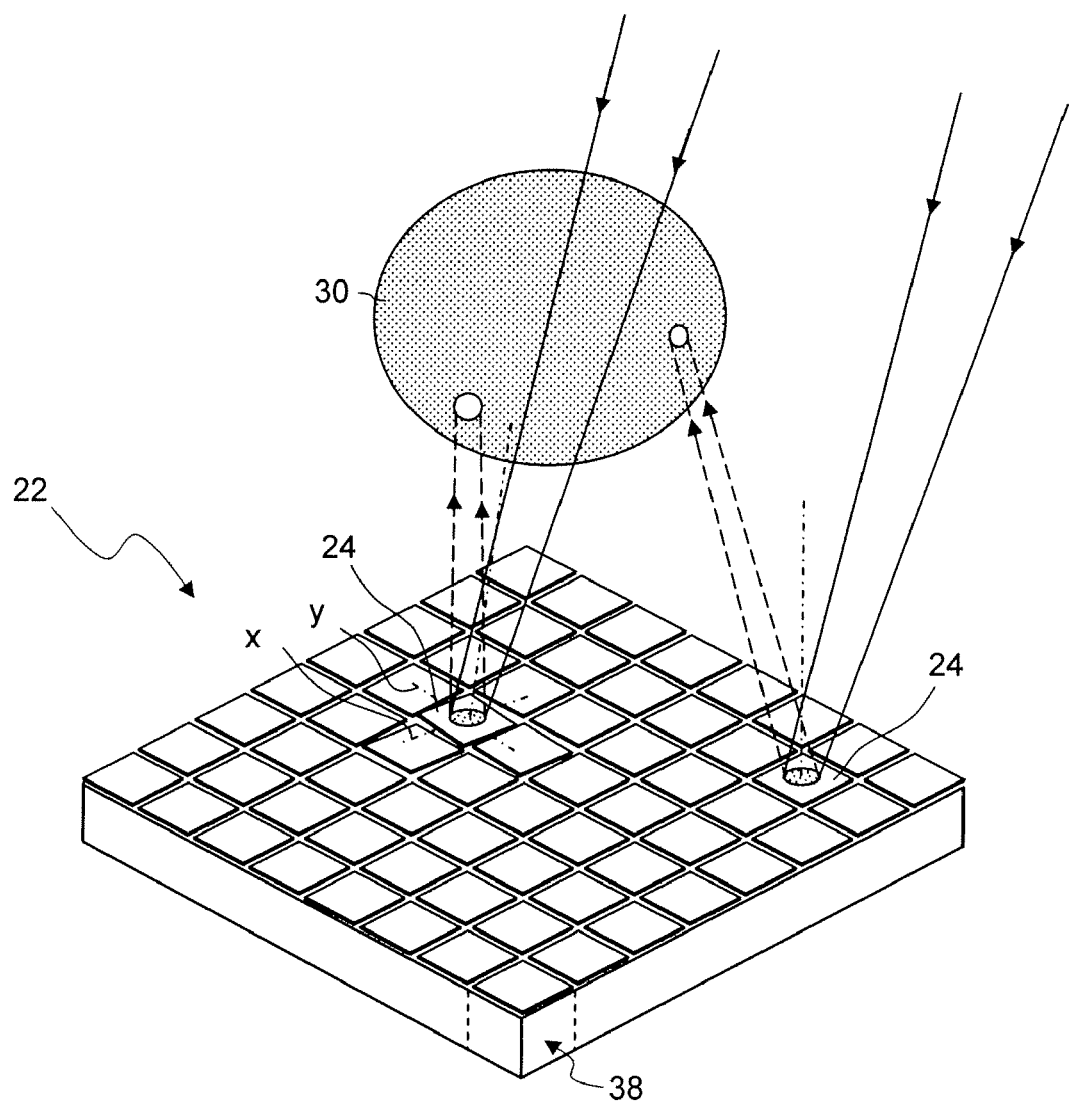
FIG. 2 shows a simplified perspective representation of a multi-mirror array, in which the individual micromirrors have a square outer contour.

FIG. 2 shows a simplified perspective representation of the multi-mirror array 22, in which the individual micromirrors 24 are plane and have a square contour. In order to direct an incident light sub-beam, which is generated by the microlens array 20 upstream in the beam path, onto any desired positions within the pupil surface 30, each micromirror 24 is mounted tiltably about two tilt axes x and y. The tilting per se about the tilt axes x, y can be controlled by actuators, and each micromirror 24 desirably is, if possible, assigned its own set of actuators so that the micromirrors 24 can be driven individually. Therefore, each micromirror 24 with the associated actuators thus forms a mirror unit 38 which is repeated over the multi-mirror array 22.

The greater the number of mirror units 38 in a multi-mirror array 22 is, the more finely the intensity distribution can be resolved in the pupil surface 30. Multi-mirror arrays 22 having several thousand micromirrors 24, tiltable about two tilt axes x, y, may be envisaged. Such multi-mirror arrays 22 may, for example, be fabricated in MEMS technology.

Figure 3:
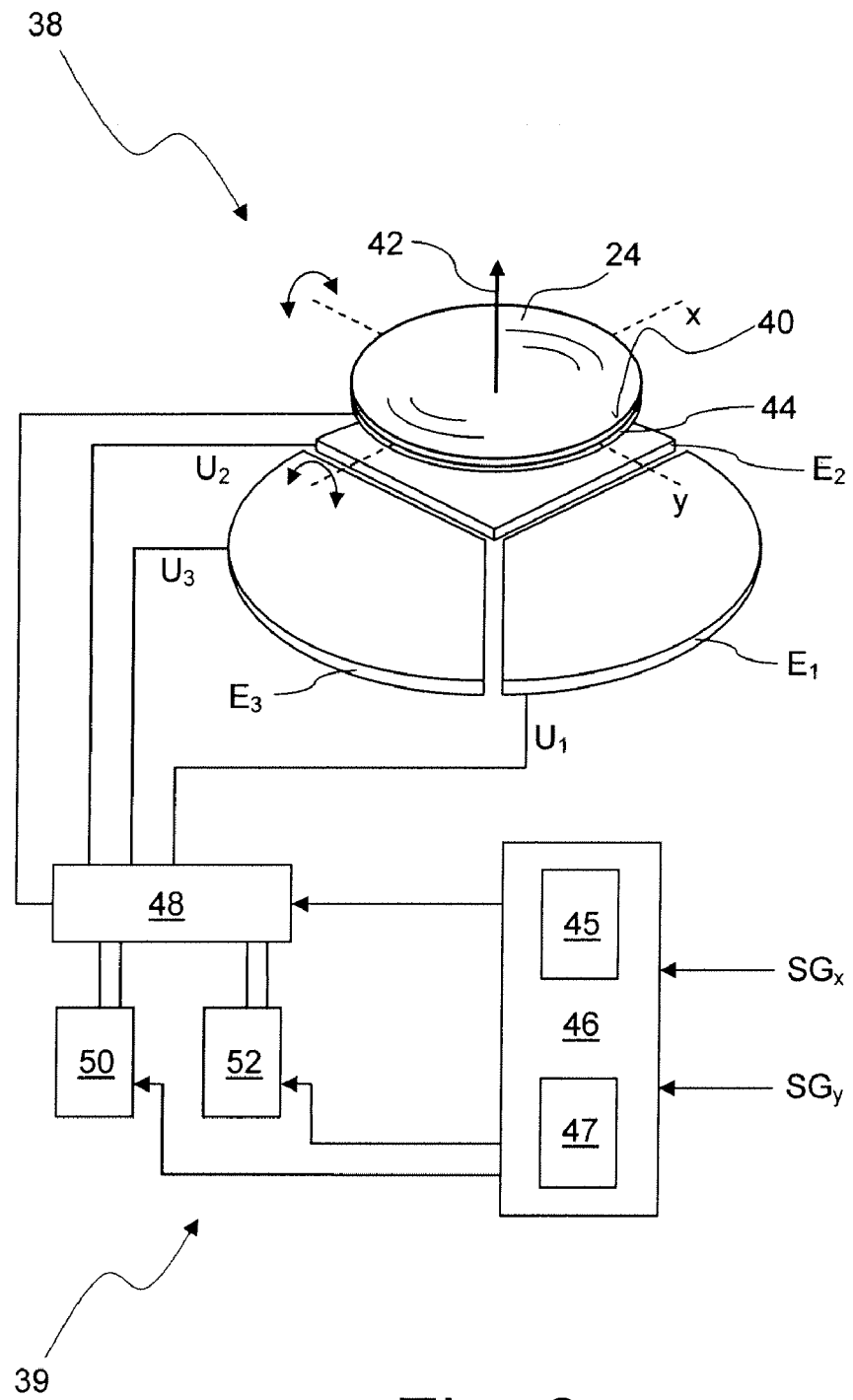
FIG. 3 shows a simplified perspective representation of a micromirror with a circular outer contour, and drive electronics for driving it.

FIG. 3 shows a highly schematised perspective representation of an embodiment of a mirror unit 38 in which, unlike in the embodiment shown in FIG. 2, the micromirror 24 has a circular contour. Drive electronics, which are part of the drive instrument 26 and by which this micromirror 24 can be driven, are denoted by 39.

The main component of the mirror unit 38 is the micromirror 24, which has a plane mirror support whose mirror surface 40 carries a coating which reflects the projection light being used, for example VUV light with a wavelength of 193 nm. The mirror surface 40 may be assigned a surface normal 42, with respect to which the incidence angle and emergence angle of the projection light striking the micromirror 24 can be defined. In the case of a curved mirror surface 40, an average surface normal 42 may be defined for this purpose.

The micromirror 24 is mounted tiltably by a universal suspension (not shown) about the two tilt axes x and y, which are represented by dashes in FIG. 3. The universal suspension, which allows two degrees of freedom in rotation, exerts a restoring moment on the micromirror 24 by resilient solid-state articulations used for supporting it, and thus keeps it in a stable central position.

A mirror electrode 44, which is produced for example by vapour depositing a metallic layer, is applied on the rear side of the micromirror 24. A first control electrode $E_1$, a second control electrode $E_2$ and a third control electrode $E_3$, which are configured as circular disc segments with a vertex angle of 120°, are applied opposite this mirror electrode 44, and therefore the entire micromirror 24, on the substrate of the mirror unit 38. For each mirror unit 38 of the multi-mirror array 22, the leads of the three control electrodes $E_1$, $E_2$ and $E_3$ and the mirror electrode 44 are fed out from the MEMS unit and connected to the associated drive electronics 39.

By applying various voltages $U_1$, $U_2$ and $U_3$ between the mirror electrode 44 and the control electrodes $E_1$, $E_2$ and $E_3$, the mirror electrode 44 is pulled by the individual control electrodes $E_1$, $E_2$ and $E_3$ owing to electrostatic attraction. This attractive force between the two electrodes is converted by the universal suspension into tilting of the micromirror 24 about the two tilt axes x and y. The control electrodes $E_1$, $E_2$ and $E_3$ therefore function as actuators for tilting the micromirror 24.

The respective tilt angle is essentially dictated by the interaction of the various voltages $U_1$, $U_2$ and $U_3$ and the restoring moments established by the solid-state articulations of the universal suspension. Other forces which act on the micromirror 24, for example gravitational forces, may be neglected in this embodiment since the micromirror 24 is intended to be very small here. Forces due to effects such as for example housing vibrations, air flows or thermal effects may, however, have a considerable influence on the real setting of the micromirror 24.

In order to achieve the simplest possible driving of the mirror unit 38, in the present embodiment control variables $SG_x$ and $SG_y$, which are assigned, preferably linearly, to the desired unperturbed tilt angles $\alpha_x$ and $\alpha_y$ about the tilt axes x and y are transmitted to the drive electronics 39. In order to convert these control variables $SG_x$, $SG_y$ into the voltages $U_1$, $U_2$ and $U_3$, the drive electronics 39 include a converter 46, a multiplexer 48 and two signal amplifiers in the form of two controllable high-voltage output stages 50 and 52. The converter 46 receives the two control variables $SG_x$ and $SG_y$ on two input lines and, via a memory 45 and/or a calculation unit 47, determines the values of the three voltages $U_1$, $U_2$ and $U_3$ which are applied to the control electrodes $E_1$, $E_2$ and $E_3$. As a function of the control variables $SG_x$, $SG_y$, according to a method explained below with the aid of FIGS. 4 to 6, one control electrode $E_1$, $E_2$ or $E_3$ is respectively selected, for example the first control electrode $E_1$, and its voltage $U_1$ relative to the mirror electrode 44 is set to zero by the multiplexer 48, i.e. it is placed at the same potential as the mirror electrode 44. Via two control lines, which lead from the converter 46 to the high-voltage output stages 50 and 52, the converter 46 then sets the other two voltages $U_2$ and $U_3$ to values which cause desired tilting of the micromirror 24. The multiplexer 48, which receives these two voltages $U_2$ and $U_3$ and is in turn driven by the converter 46, sets the selected control electrode $E_1$ to zero and applies the associated voltages $U_2$ and $U_3$ to the other two control electrodes $E_2$ and $E_3$.

In this way, at each instant only two signal amplifiers are involved for driving the three actuators, in order to achieve desired tilting of the micromirror 24 about the two tilt axes x, y. Owing to the multiplicity of mirror units 38 in a multi-mirror array 22, this greatly reduces the outlay on hardware which is desired for driving the micromirrors 24.

If for example electromagnetic actuators are used instead of the electrostatic control electrodes $E_1$, $E_2$ or $E_3$ in another embodiment, then the control signals, which are formed here by the various voltages $U_1$, $U_2$ and $U_3$, may for example be generated by constant-current sources instead of the high-voltage output stages 50 and 52. In particular, the signals specified by the converter 46 may also be transmitted in purely digital form to the signal amplifiers being used, as is possible in the case of digital-analogue converters with an integrated power output stage.

If the actuators being used involve a particular mutual signal, then instead of setting the control signal of the selected actuator to zero, a control signal which is constant over a plurality of mirror units 38 of the multi-mirror array 22 may also be applied by the multiplexer 48. In this way, the number of signal amplifiers per mirror unit 38 is reduced on average over the multi-mirror array 22 in this case as well.

A calculation method by which the three control signals, which are applied to the actuators of the mirror unit 38, can be determined will be described below with the aid of FIGS. 4 to 6.

The starting point of the method is the two control variables $SG_x$ and $SG_y$, which are transmitted for example from the output of a control and regulation algorithm to the converter 46 and are assigned to desired angles, i.e. unperturbed tilt angles $\alpha_x$ and $\alpha_y$ of the micromirror 24 about the respective tilt axis x, y. For given control variables $SG_x$ and $SG_y$, the method is therefore desirably capable of determining as precisely as possible the voltages $U_1$, $U_2$ and $U_3$ which cause the micromirror 24 to tilt into the corresponding unperturbed tilt angles $\alpha_x$ and $\alpha_y$.

To a first approximation in the case of electrostatic actuators, the torques with which the control electrodes $E_1$, $E_2$ and $E_3$ act on the micromirror 24 may be assumed to be proportional to the square of the respective voltage $U_1$, $U_2$ and $U_3$. The restoring moments caused by the solid-state articulations of the universal suspension, which are in equilibrium with these torques, are approximately proportional to the tilting of the micromirror 24 so long as movement takes place in the elastic range of the solid-state articulations. The proportionality constants of the restoring moments, which are also referred to as rotational spring constants, may be set differently in the direction of the tilt axes x and y. With the aid of these rotational spring constants, which are indicated here by their reciprocal value as $c_x$ and $c_y$ for the sake of simpler formula notation, it is therefore possible to formulate the following simple model for the dependency of the unperturbed tilt angles $\alpha_x$ and $\alpha_y$ on the applied voltages $U_1$, $U_2$ and $U_3$:

$$\begin{pmatrix} \alpha_x \\ \alpha_y \end{pmatrix} = \begin{pmatrix} c_x e_{1x} \\ c_y e_{1y} \end{pmatrix} \cdot U_1^2 + \begin{pmatrix} c_x e_{2x} \\ c_y e_{2y} \end{pmatrix} \cdot U_2^2 + \begin{pmatrix} c_x e_{3x} \\ c_y e_{3y} \end{pmatrix} \cdot U_3^2 \quad (1)$$

Here, $e_1=(e_{1x},e_{1y})^T$, $e_2=(e_{2x},e_{2y})^T$ and $e_3=(e_{3x},e_{3y})^T$ are proportionality factors in the coordinate system of the tilt axes x,y, which, through multiplication by the squared voltages $U_1^2$, $U_2^2$ and $U_3^2$, give the torque which is caused by the individual control electrodes $E_1$, $E_2$ and $E_3$. These proportionality factors are therefore also influenced for example by different orientations or configurations of the control electrodes $E_1$, $E_2$ and $E_3$ and the mirror electrode 44, but also by manufacturing tolerances during their production. Vectors respectively rotated through 120°, the length of which corresponds to the force action of the electrodes, may be set as $e_1$, $e_2$ and $e_3$ for the case assumed here in which the control electrodes $E_1$, $E_2$ and $E_3$ are positioned ideally with threefold symmetry and are identical.

By combining the coefficients and rearrangement, Equation (1) can be rewritten more simply as:

$$\begin{pmatrix} \alpha_x \\ \alpha_y \end{pmatrix} = \begin{bmatrix} p_{1x} & p_{2x} & p_{3x} \\ p_{1y} & p_{2y} & p_{3y} \end{bmatrix} \cdot \begin{pmatrix} U_1^2 \\ U_2^2 \\ U_3^2 \end{pmatrix} =: T \begin{pmatrix} U_1^2 \\ U_2^2 \\ U_3^2 \end{pmatrix} \quad (2)$$

The entries of the matrix T, which represent the model parameters $p_{1x}$, $p_{1y}$, $p_{2x}$, $p_{2y}$, $p_{3x}$, $p_{3y}$ of the mirror unit 38, may be obtained either from design data or by a measurement method. An example of such a measurement method will be explained in more detail below.

If there is not a quadratic dependency of the torque on the respective voltages $U_1$, $U_2$ and $U_3$ owing to a different embodiment, for example of the form of electrode, the vector with the squared voltages may at any time be replaced by arbitrary functions $f_i(U_i)$ in the model above.

Equation System (2) has infinitely many solutions, which may partly be restricted by using voltages $U_1$, $U_2$ and $U_3$ greater than or equal to zero for the sake of simplicity, since the electrostatic attraction effect between two electrodes is independent of the polarity of the voltage being used and the high-voltage output stages 50, 52 can therefore be configured for a voltage range with only one polarity.

If one of the voltages $U_1$, $U_2$ and $U_3$ is now set equal to zero, then Equation System (2) becomes uniquely solvable since there are now only two unknowns to be determined. For particular tilting of the micromirror 24 about the two tilt axes x and y, however, it is not possible to set any voltage $U_1$, $U_2$ or $U_3$ to zero. For this reason, in a first step it is desirable to select the control electrode $E_1$, $E_2$ and $E_3$ whose voltage $U_1$, $U_2$ or $U_3$ can be set to zero.

As may be seen in particular from FIG. 4, the control variables $SG_x$ and $SG_y$ span a control variable space which is assigned to the space of the unperturbed tilt angles $\alpha_x$ and $\alpha_y$ about the tilt axes x and y. In principle this assignment or coordinate transformation may be made in any desired way, the control variables $SG_x$ and $SG_y$ being assigned preferably independently of one another and linearly to their respective tilt angle. In the present embodiment, an identical assignment between the control variables $SG_x$, $SG_y$ and the unperturbed tilt angles $\alpha_x$, $\alpha_y$ is assumed. The coordinate axes of the two spaces therefore correspond to each other, as is indicated in FIG. 4. In the control variable space, various combinations of control variables $SG_x$, $SG_y$ can now be plotted as different control variable vectors SGV.

Furthermore, as is indicated in FIG. 4 by the control electrodes $E_1$, $E_2$ and $E_3$ and effective tilt vectors $w_1$, $w_2$ and $w_3$ assigned to them, the effects of the control electrodes $E_1$, $E_2$ and $E_3$, which they have on the micromirror 24, may also be taken into account in this control variable space. The respective effective tilt vector $w_1$, $w_2$ or $w_3$ of a control electrode $E_1$, $E_2$ or $E_3$ is in this case given by the control variables $SG_x$, $SG_y$ that are assigned to those unperturbed tilt angles $\alpha_x$, $\alpha_y$ which the micromirror 24 adopts when only this control electrode $E_1$, $E_2$ or $E_3$ is driven with a type of standard voltage.

Except for multiplication by a standard voltage and the representation in the control variable space, the effective tilt vectors $w_1$, $w_2$ or $w_3$ therefore correspond to the entries, or more precisely the columns, of the matrix T, which represent the model parameters $p_{1x}$, $p_{1y}$, $p_{2x}$, $p_{2y}$, $p_{3x}$, $p_{3y}$ of the mirror unit 38 in Equation (2). In the embodiment having control electrodes $E_1$, $E_2$ and $E_3$ arranged with threefold symmetry, an alignment angle φ between the first control electrode $E_1$ and the tilt axis y, which is due for example to manufacturing tolerances, is therefore also taken into account.

If a desired combination of perturbed tilt angles $\alpha_x$ and $\alpha_y$, or more precisely the control variables $SG_x$, $SG_y$ assigned to them, is now plotted as a control variable vector SGV in the diagram of FIG. 4, then this may also be represented by a linear combination of the three effective tilt vectors $w_1$, $w_2$ or $w_3$ of the three control electrodes $E_1$, $E_2$ and $E_3$.

According to the prior art, the equation system of Equation (2) has previously been solved as shown in FIG. 5, with the additional constraint condition that the total force $F_z$ which acts on the mirror element 24 is kept constant. This means that the sum $U_1^2 + U_2^2 + U_3^2$ is desirably of equal value for each control variable vector SGV. This has given for example the voltage profiles of $U_1$ (continuous), $U_2$ (dashed) and $U_3$ (dotted) shown at the top in FIG. 5 for one complete rotation of a given control variable vector SGV about the origin of the diagram in FIG. 4, which corresponds to moving the surface normal 42 of the micromirror 24 on a conical surface with a given vertex angle.

In the present embodiment, however, the constraint condition of keeping constant the total force $F_z$ on the micromirror 24 is omitted, and instead one of the three control electrodes $E_1$, $E_2$ or $E_3$ is selected and its voltage $U_1$, $U_2$ or $U_3$ is set to zero. Admittedly, this cannot exclude the possibility that the micromirror 24 will execute minor excursion movements in the direction perpendicular to the tilt axes. Such excursion movements, however, are generally not detrimental to the optical function since the excursion movements in the case of plane micromirrors 24 do not affect the directions in which the projection light is being deviated.

To this end, the orientation of the control variable vector SGV with respect to the effective tilt vectors $w_1$, $w_2$ or $w_3$ of the three control electrodes $E_1$, $E_2$ and $E_3$ is determined. In this case, the equation $$\theta = \arctan\left(\frac{SGy}{SGx}\right) \tag{3}$$

may be used in order to determine the angle $\theta$, while taking the respective quadrant into account.

If the angle $\theta$ lies in the angle range $[\phi, 120°+\phi]$, i.e. the control variable vector SGV lies between the effective tilt vector $w_1$ of the first control electrode $E_1$ and the effective tilt vector $w_2$ of the second control electrode $E_2$, then the control signal of the third control electrode $E_3$ i.e. $U_3$ is set=0 and the control variable vector SGV is generated as a linear combination of the effective tilt vectors $w_1$ and $w_2$. For the solution of the linear equations system, this gives:

$$\begin{pmatrix} \alpha_x \\ \alpha_y \end{pmatrix} = \begin{bmatrix} p_{1x} & p_{2x} & p_{3x} \\ p_{1y} & p_{2y} & p_{3y} \end{bmatrix} \cdot \begin{pmatrix} U_1^2 \\ U_2^2 \\ 0 \end{pmatrix} \tag{4}$$

$$= \begin{bmatrix} p_{1x} & p_{2x} \\ p_{1y} & p_{2y} \end{bmatrix} \cdot \begin{pmatrix} U_1^2 \\ U_2^2 \end{pmatrix} = T' \begin{pmatrix} U_1^2 \\ U_2^2 \end{pmatrix}$$

This equation can be solved uniquely by $$\begin{pmatrix} U_1 \\ U_2 \end{pmatrix} = +\sqrt{T'^{-1}\begin{pmatrix} \alpha_x \\ \alpha_y \end{pmatrix}} \tag{5}$$

when a positive solution is selected for the root. The root in Equation (5) is to be understood as taking the root component by component.

If the angle $\theta$ lies in the angle range $[120°+\phi, 240°+\phi]$, then, as may be seen in FIG. 4, $U_1=0$ is set and the other two equations are determined according to $$\begin{pmatrix} U_2 \\ U_3 \end{pmatrix} = +\sqrt{T''^{-1}\begin{pmatrix} \alpha_x \\ \alpha_y \end{pmatrix}} \text{ with } T'' = \begin{bmatrix} p_{2x} & p_{3x} \\ p_{2y} & p_{3y} \end{bmatrix} \tag{6}$$

For $\theta$ within $[240°+\phi, 360°+\phi]$, $U_2=0$ is correspondingly set and $U_1$ and $U_3$ are determined according to $$\begin{pmatrix} U_1 \\ U_3 \end{pmatrix} = +\sqrt{T'''^{-1}\begin{pmatrix} \alpha_x \\ \alpha_y \end{pmatrix}} \text{ with } T''' = \begin{bmatrix} p_{1x} & p_{3x} \\ p_{1y} & p_{3y} \end{bmatrix} \tag{7}$$

In the solutions above, the two unperturbed tilt angles $\alpha_x$ and $\alpha_y$ can now generally be replaced by assignment functions $\alpha_i=f(SG_i)$ using the control variables $SG_x$, $SG_y$. A method of calculating the three voltages $U_1$, $U_2$ and $U_3$ from the control variables $SG_x$ and $SG_y$ is therefore obtained for all control variable vectors SGV.

The upper part of FIG. 6 illustrates the profile of the voltages $U_1$ (continuous), $U_2$ (dashed) and $U_3$ (dotted) and shows that with the method used here, inter alia lower maximum voltages are used in order to achieve particular tilting, since the control electrode $E_1$, $E_2$ or $E_3$ whose effective tilt vector $w_1$, $w_2$ or $w_3$ contains a component that would oppose the control variable vector SGV is respectively set to zero. The working range of the high-voltage output stages 50, 52 can therefore be selected to be smaller, so that smaller quantisation stages for the individual voltages and concomitantly smaller errors can be achieved. The lower part of FIG. 6 also shows the variation in the total force $F_z$, which occurs in the method described here and leads to the excursion movements already mentioned above.

As already indicated above, a measurement method may be used for determining the model parameters $p_{1x}$, $p_{1y}$, $p_{2x}$, $p_{2y}$, $p_{3x}$, $p_{3y}$, i.e. the entries of the matrix T, in order to take into account process variations in the production of the mirror units 38. In such a measurement method, various voltages $U_1$, $U_2$ and $U_3$ are applied and the tilt angles $\alpha_x$ and $\alpha_y$ resulting therefrom are measured. In order to demonstrate this, Equation System (2) may be rewritten as $$\begin{pmatrix} \alpha_x \\ \alpha_y \end{pmatrix} = \begin{bmatrix} U_1^2 & U_2^2 & U_3^2 & 0 & 0 & 0 \\ 0 & 0 & 0 & U_1^2 & U_2^2 & U_3^2 \end{bmatrix} \underbrace{\begin{pmatrix} p_{1x} \\ p_{2x} \\ p_{3x} \\ p_{1y} \\ p_{2y} \\ p_{3y} \end{pmatrix}}_{\vec{p}} \tag{8}$$

This notation now illustrates that the original entries $p_{1x}$, $p_{1y}$, $p_{2x}$, $p_{2y}$, $p_{3x}$, $p_{3y}$ of the matrix T, in the form of a column vector $\vec{p}$, represent the unknowns of an equation system with two equations.

The model parameters $p_{1x}$, $p_{1y}$, $p_{2x}$, $p_{2y}$, $p_{3x}$, $p_{3y}$ could not be determined with only one measurement, since the equation system of Equation (8) would not be sufficiently determined. With N measurement points, $N \geq 3$ being desired, i.e. there are N assignments of the three voltages $U_1$, $U_2$ and $U_3$ to the two tilt angles $\alpha_x$ and $\alpha_y$, Equation (8) can however be set up N times:

$$\underbrace{\begin{pmatrix} \alpha_{x1} \\ \alpha_{y1} \\ \vdots \\ \alpha_{xN} \\ \alpha_{yN} \end{pmatrix}}_{\vec{\alpha}} + \vec{e} = \underbrace{\begin{bmatrix} U_{11}^2 & U_{21}^2 & U_{31}^2 & 0 & 0 & 0 \\ 0 & 0 & 0 & U_{11}^2 & U_{21}^2 & U_{31}^2 \\ \vdots & \vdots & \vdots & \vdots & \vdots & \vdots \\ U_{1N}^2 & U_{2N}^2 & U_{3N}^2 & 0 & 0 & 0 \\ 0 & 0 & 0 & U_{1N}^2 & U_{2N}^2 & U_{3N}^2 \end{bmatrix}}_{H} \underbrace{\begin{pmatrix} p_{1x} \\ p_{2x} \\ p_{3x} \\ p_{1y} \\ p_{2y} \\ p_{3y} \end{pmatrix}}_{\vec{p}} \quad (9)$$

The vector $\vec{e}$ stands for the measurement inaccuracy inherent in each measurement. If the voltages $U_{11}$ to $U_{3N}$ are now selected so that the matrix H has full rank, then the unknown model parameters $p_{1x}, p_{1y}, p_{2x}, p_{2y}, p_{3x}, p_{3y}$ can be determined from Equation System (9).

The parameter vector $\vec{p}$ is in this case estimated by $$\vec{p} = (H^T H)^{-1} H^T \vec{\alpha} \quad (10)$$

for example with a least-squares estimator or another estimator, in order to eliminate as far as possible the error of the parameter vector, or more precisely the influence of the measurement inaccuracies, by the larger number of measurements.

Instead of modelling the relationship between the applied voltages $U_1$, $U_2$ and $U_3$ and the unperturbed tilt angles $\alpha_x$, $\alpha_y$ resulting therefrom in a calculation model, a somewhat different method of determining the voltages $U_1$, $U_2$ and $U_3$ consists in simply reading it from a so-called look-up table which has been determined beforehand.

To this end, $N^2$ unperturbed tilt angles $\alpha_x$, $\alpha_y$ within the angle ranges of the two tilt axes x, y are activated in a measurement run, and these are stored together with the voltages $U_1$, $U_2$ and $U_3$ used for this in a table, preferably in an electronic memory. The $N^2$ measurement points are expediently distributed uniformly on an N×N grid inside the angle ranges of the two tilt axes x, y. The activation of the individual tilt angles may for example be carried out with the aid of a regulation algorithm, to which the measured tilt angles $\alpha_x$, $\alpha_y$ are in turn supplied. The individual tilt angles of the measurement run may, however, also be activated only with a control algorithm in which the real tilt angles are merely measured and stored with the associated voltages $U_1$, $U_2$ and $U_3$ in the table.

For each combination of control variables $SG_X$, $SG_Y$ and the look-up table, with the aid of a given assignment between the control variables $SG_X$, $SG_Y$ and the unperturbed tilt angles $\alpha_x$, $\alpha_y$, the associated voltages $U_1$, $U_2$ and $U_3$ can be read out during operation and applied to the control electrodes $E_1$, $E_2$ and $E_3$. Since the values of the voltages $U_1$, $U_2$ and $U_3$ are available only at the positions of the N×N tilt angles $\alpha_x$, $\alpha_y$, intermediate values may be calculated by interpolation, for example bilinearly or bicubically.

These procedures just explained may also be combined, in order to set one of the voltages $U_1$, $U_2$ or $U_3$ to zero as explained above by already setting one of the voltages $U_1$, $U_2$ or $U_3$ to zero when compiling the look-up table, or more precisely when activating the $N^2$ tilt angles $\alpha_x$, $\alpha_y$. The outlay on signal amplifiers can also be kept small by this approach.

Since the mirror units 38 in genuine systems are always subject to certain perturbations z, a control and regulation algorithm 54 which adjusts real actual values of the micromirror 24, according to specified target tilt angles, will be explained below.

Figure 7:
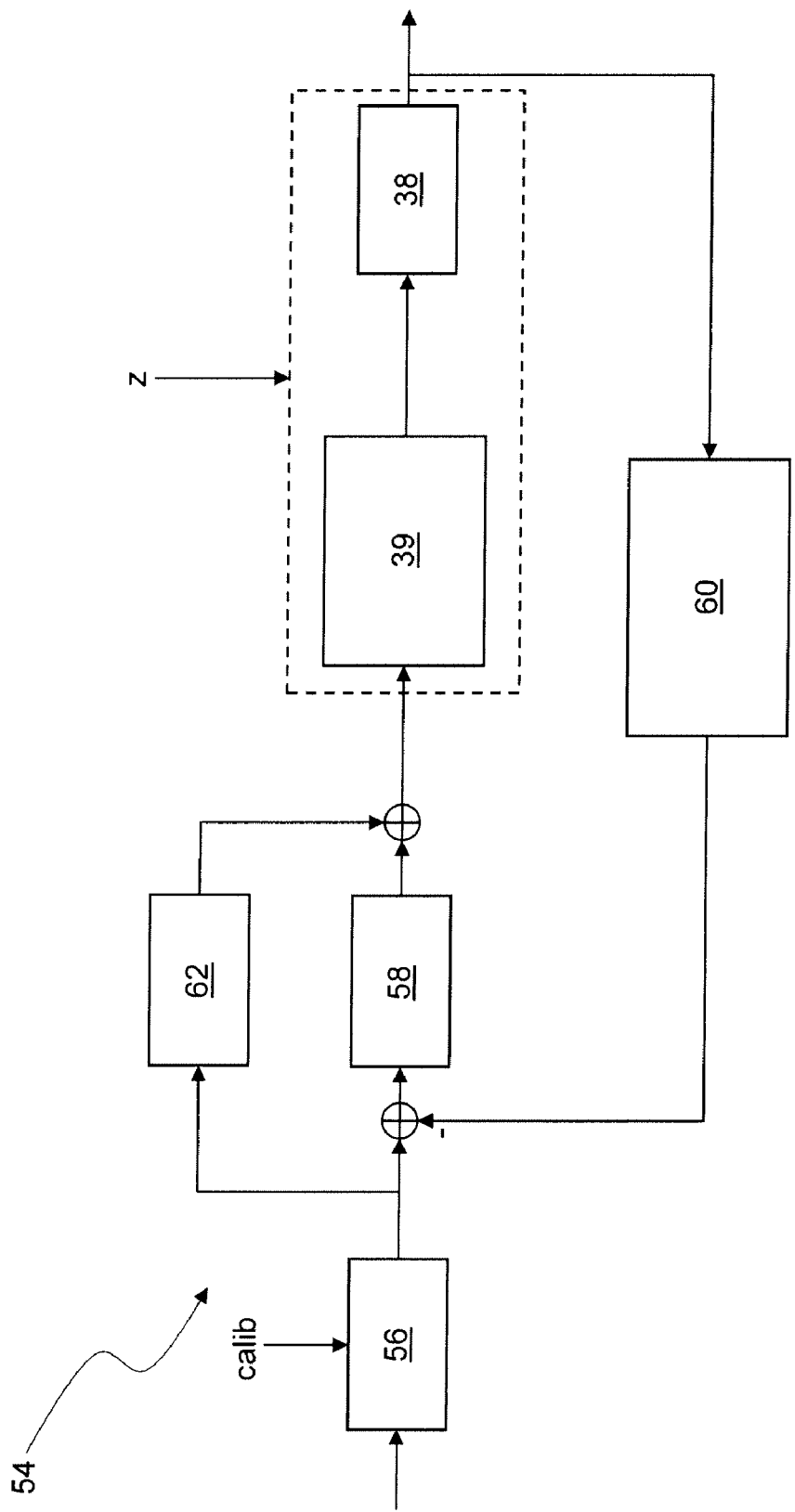
FIG. 7 shows a schematic representation of a control and regulation algorithm for driving the micromirror.

To this end, FIG. 7 shows a diagram of the control and regulation system 54 as part of the drive instrument 26, the various components of which may be embodied individually as devices. Preferably, however, the functions of the control and regulation algorithm 54 are undertaken by digital algorithms, which are carried out for example in a digital signal processor (DSP). For this reason, comments below about various components are also intended to refer to embodiments in the form of algorithms. Various embodiments may optionally contain only individual parts of these control and regulation components.

The regulation section represented by dashes, which acts on the perturbation z, includes the mirror unit 38 including the micromirror 24 and the associated drive electronics 39. If a linear, preferably identical assignment has been selected for assigning the control variables $SG_X$, $SG_Y$ to the unperturbed tilt angles $\alpha_x$, $\alpha_y$ of the micromirror 24 about the two tilt axes x, y, then, owing to the drive electronics 39, the considerations about the control and regulation components remain free from the complex dependencies of the unperturbed tilt angles $\alpha_x$, $\alpha_y$ on the three control signals of the actuators, which are applied here in the form of voltages $U_1$, $U_2$ and $U_3$ to the control electrodes $E_1$, $E_2$ and $E_3$ of the mirror unit 38. The logic of the control and regulation components is therefore kept straightforward, which inter alia simplifies their layout.

At the input of the control and regulation algorithm 54, a trajectory determination unit 56 receives the target angle, through which the micromirror 24 is finally intended to be tilted, from a superordinate system or the user. From these target tilt angles, the trajectory determination unit 56 then determines a sequence of a setpoint tilt angles which converts the actual tilt angles, through which the micromirror 24 is instantaneously tilted, into the target tilt angles. This allows, for example, smooth activation of the target tilt angles. Calibration data, which can be used in order to adapt the actual tilt angles with respect to superordinate systems, may furthermore be transmitted to the trajectory determination unit 56.

The sequence of setpoint tilt angles is transmitted to a regulator 58 that determines or corrects the control variables $SG_X$, $SG_Y$, which are transmitted to the drive electronics 39 of the mirror unit 38. To this end the regulator 58 uses a regulation difference e, which is given by the setpoint tilt angles at the instant in question and negative feedback of the actual tilt angles measured by a monitoring system 60. A regulator 58 configured as a simple PID regulator may be parameterised according to the regulation characteristics of the regulation section.

A predictive controller 62 is furthermore provided in the present embodiment, which contains an inverse system dynamics model of the regulation section and thus anticipates the reaction of the micromirror 24 to a change in the control variables $SG_X$, $SG_Y$. Such a solution is recommendable in particular owing to the multiplicity of individual mirror units 38, since the regulation frequency of the closed control loop via the regulator 58, dictated essentially by the limited bandwidth of the monitoring system 60, may be relatively low.

The predictive controller 62 therefore includes the predictable reaction of the control section, and the regulator 58 corrects the control variables $SG_X$, $SG_Y$ specified by the predictive controller 62 in order to compensate for the perturbation z acting on the control section and errors of the drive electronics 39.

The control variables $SG_X$, $SG_Y$ thus determined and optionally corrected are then converted by the drive electronics 39 into control signals according to the method presented above, and these are applied to the actuators of the mirror unit 38.

All the described methods and devices for driving a micromirror 24 in a multi-mirror array 22 may also be employed in illumination systems for the use of EUV light, i.e. light with a wavelength in the range of a few nanometres, for example 13.6 nm.

The above description of the preferred embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. A method, comprising:
   a) providing a micromirror array in an illumination system of a microlithographic projection exposure apparatus, the micromirror array comprising a micromirror which is tiltable through a respective tilt angle about two tilt axes, the micromirror being assigned three actuators, each of the three actuators being capable of being driven by control signals to tilt the micromirror about the two tilt axes;
   b) specifying two control variables, each of the two control variables being assigned to one tilt axis, and both of the two control variables being assigned to unperturbed tilt angles;
   c) for any desired combinations of the two control variables, as a function of the two control variables, selecting one of the three actuators whose control signal is set to a constant value;
   d) determining the control signals so that, when the control signals are applied to the other two actuators, the micromirror adopts the unperturbed tilt angles as a function of the two control variables; and
   e) applying the control signals to the actuators.

2. The method according to claim 1, wherein the control variables are assigned linearly to the unperturbed tilt angles.

3. The method according to claim 1, comprising selecting the actuator whose control signal is set to a constant value by:
   assigning a two-dimensional control variable vector with a direction to the two control variables, which are assigned to the unperturbed tilt angles about the two tilt axes;
   assigning an effective tilt vector to each individual actuator; and then
   selecting the actuator whose effective tilt vector has a direction which is not immediately adjacent to the direction of the control variable vector.

4. The method according to claim 3, comprising obtaining the effective tilt vector of an actuator from the control variables that are assigned to the unperturbed tilt angles which the micromirror adopts when only this actuator is driven.

5. The method according to claim 3, comprising determining the effective tilt vectors by measurement.

6. The method according to claim 3, comprising determining the directions of the control variable vector and the effective tilt vectors according to $$\theta = \arctan\left(\frac{SG_y}{SG_x}\right)$$

where $SG_x$ and $SG_y$ are the control variables assigned to the unperturbed tilt angles about the respective tilt axis and $\theta$ indicates the angle that the respective vector makes with a first direction which coincides with one of the two tilt axes.

7. The method according to claim 6, wherein:
   the effective tilt vector of a first actuator of the three actuators has a direction which coincides with the first direction to within an alignment angle;
   the effective tilt vector of a second actuator of the three actuators essentially makes an angle of 120° with the effective tilt vector of the first actuator;
   the effective tilt vector of a third actuator of the three actuators essentially makes an angle of 120° with the effective tilt vector of the second actuator; and
   the method comprises:
      determining the direction $\theta$ of the control variable vector; and
      then selecting the third actuator for $\theta \in [\phi, 120°+\phi]$, the first actuator for $\theta \in [120°+\phi, 240°+\phi]$, and the second actuator for $\theta \in [240°+\phi, 360°+\phi]$.

8. The method according to claim 1, wherein the actuators are arranged with threefold symmetry.

9. The method according to claim 1, comprising determining the two control variables from setpoint tilt angles in b) by an algorithm selected from the group consisting of a control algorithm, a regulation algorithm, and a combined control and regulation algorithm.

10. The method according to claim 9, comprising:
    specifying target tilt angles; and
    determining a trajectory including a sequence of setpoint tilt angles, which represents a transition of actual tilt angles through which the micromirror is instantaneously tilted to the target tilt angles.

11. The method according to claim 9, comprising considering calibration data when determining the setpoint tilt angles.

12. The method according to claim 9, comprising specifying or correcting the two control variables by a regulation algorithm, wherein the regulation algorithm receives a regulation difference which is determined from the setpoint tilt angles and negative feedback of the actual tilt angles through which the micromirror is instantaneously tilted.

13. The method according to claim 9, comprising specifying the two control variables by assigning them to the setpoint tilt angles via an algorithm which uses an inverse system dynamics model.

14. The method according to claim 1, wherein c) and d) comprise determining the control signals for given control variables from an assignment table.

15. The method according to claim 14, comprising:
    compiling the assignment table between the two control variables and the three control signals in a parameterisation phase by applying various control signals to the three actuators; and
    measuring the tilt angles resulting from compiling the assignment table; and assigning the two control variables linearly to the resulting tilt angles,
    wherein one control signal respectively is kept constant when the control signals are being applied.

16. The method according to claim 1, wherein c) and d) comprise determining the control signals for given control variables via a calculation rule which uses a parameter vector.

17. The method according to claim 16, comprising determining the parameter vector in a parameterisation phase by estimation from at least three assignments between tilt angles and the control signals of the three actuators, wherein the at least 3 assignments are determined by applying various control signals to the three actuators and measuring tilt angles resulting therefrom.

18. The method according to claim 17, comprising estimating the parameter vector by a least-squares estimator.

19. The method according to claim 1, wherein the micromirror can respectively adopt at least 3 different tilt angles about the tilt axes.

20. A method, comprising:
   a) providing a micromirror array which is arranged in an illumination system of a microlithographic projection exposure apparatus, the micromirror array comprising a micromirror, the micromirror being tiltable through a respective tilt angle about two tilt axes, and the micromirror being assigned three actuators which are driven by control signals to tilt the micromirror about the two tilt axes;
   b) compiling an assignment table between the tilt angles and the control signals of the three actuators by activating and measuring a plurality of tilt angles of the micromirror and storing the control signals applied to the three actuators;
   c) specifying two control variables, each of the two control variables being assigned to one tilt axis, and both of the control variables being assigned linearly to the unperturbed tilt angles;
   d) determining control signals which cause the micromirror to tilt through the unperturbed tilt angles, by linearly assigning the two control variables to the tilt angles of the assignment table according to the assignment in c) and reading out the control signals assigned to these tilt angles from the assignment table; and
   e) applying the control signals to the actuators.

21. A method, comprising:
   a) providing a micromirror array which is arranged in an illumination system of a microlithographic projection exposure apparatus, the micromirror array comprising a micromirror, the micromirror being tiltable through a respective tilt angle about two tilt axes, and the micromirror being assigned three actuators which are respectively driven by control signals in order to tilt the micromirror about the two tilt axes;
   b) determining at least 3 assignments between tilt angles and the control signals of the three actuators by activating and measuring various tilt angles of the micromirror and the control signals applied to the three actuators;
   c) estimating a parameter vector from the assignments obtained in b);
   d) specifying two control variables, each of which is assigned to one tilt axis;
   e) determining the control signals for given control variables via a calculation rule which uses the estimated parameter vector; and
   f) applying the control signals to the actuators.

22. A drive electronics configured to drive a micromirror of a micromirror array, the micromirror array being in an illumination system of a microlithographic projection exposure apparatus, the micromirror having two tilt axes, three actuators being assigned to the micromirror to tilt the micromirror about the two tilt axes, the drive electronics comprising:
   a) a converter comprising an input for control variables which are assigned to unperturbed tilt angles about the two tilt axes;
   b) two signal amplifiers controllable via the converter; and
   c) a switching configured to apply control signals to the three actuators, wherein:
   as a function of the control variables applied to the input of the converter, the control signal of one of the three actuators is set to a constant value via the converter and the switching unit; and
   the other two control signals are applied to the actuators via the converter, the switching unit and the two signal amplifiers so that the micromirror adopts the unperturbed tilt angles, assigned to the control variables, about the two tilt axes.

23. The drive electronics according to claim 22, wherein:
   the input for control variables of the converter is connected to a system configured so that control variables are determined from setpoint tilt angles; and
   the system is selected from the group consisting of a control system, a regulation system, and a combined control and regulation system.

24. The drive electronics according to claim 22, wherein the converter comprises a memory for an assignment table, from which the control signals of the three actuators are determined as a function of the control variables applied to the input of the converter.

25. The drive electronics according to claim 22, wherein the converter comprises a calculation unit by which, via a calculation rule which uses a parameter vector, the control signals of the three actuators are calculated as a function of the control variables applied to the input of the converter.

26. A system, comprising:
   the drive electronics according to claim 22; and
   the illumination system comprising the micromirror array comprising the micromirror.

27. A drive electronics configured to drive a micromirror of a micromirror array, the micromirrror array being in an illumination system of a microlithographic projection exposure apparatus, the micromirror having two tilt axes and the micromirror being assigned three actuators, which are respectively driven by control signals to tilt the micromirror about the two tilt axes, the drive electronics comprising:
   a) a converter comprising an input for control variables which are assigned to unperturbed tilt angles about the two tilt axes; and
   b) signal amplifiers which are controlled via the converter and are connected directly or indirectly to the actuators so that the control signals are applied to the actuators,
   wherein the converter comprises a memory for an assignment table from which control signals of the three actuators are determined as a function of the control variables applied to the input of the converter.

28. A drive electronics configured to drive a micromirror of a micromirror array, the micromirror array being in an illumination system of a microlithographic projection exposure apparatus, the micromirror having two tilt axes and the micromirror being assigned three actuators which are respectively driven by control signals to tilt the micromirror about the two tilt axes, the drive electronics comprising:
   a) a converter comprising an input for control variables which are assigned to unperturbed tilt angles about the two tilt axes; and
   b) signal amplifiers which are controlled by means of the converter and are connected directly or indirectly to the actuators so that the control signals are applied to the actuators;
   wherein the converter comprises a calculation unit by which, via a calculation rule that uses a parameter vector which is estimated in a parameterization phase, the control signals of the three actuators are calculated as a function of the control variables applied to the input of the converter.

* * * * *

UNITED STATES PATENT AND TRADEMARK OFFICE
CERTIFICATE OF CORRECTION

PATENT NO.       : 8,345,224 B2
APPLICATION NO.  : 13/038734
DATED            : January 1, 2013
INVENTOR(S)      : Jan Horn et al.

It is certified that error appears in the above-identified patent and that said Letters Patent is hereby corrected as shown below:

In the Specifications:

Column 16,
Line 14, delete "$SG_X$, $SG_Y$" and insert --$SG_x$, $SG_y$--

Column 16,
Line 38, delete "$SG_X$, $SG_Y$" and insert --$SG_x$, $SG_y$--

Column 16,
Line 50, delete "$SG_X$, $SG_Y$" and insert --$SG_x$, $SG_y$--

Column 16,
Line 57, delete "$SG_X$, $SG_Y$" and insert --$SG_x$, $SG_y$--

Column 16,
Line 61, delete "$SG_X$, $SG_Y$" and insert --$SG_x$, $SG_y$--

In the Claims:

Column 19,
Line 38, after "between" insert --the--

Column 19,
Line 60, after "switching" insert --unit--

Column 20,
Line 28, delete "micromirrror" and insert --micromirror--

Column 20,
Line 41, before "control" insert --the--

Signed and Sealed this
Twenty-third Day of April, 2013

Teresa Stanek Rea
*Acting Director of the United States Patent and Trademark Office*